United States Patent
Chang

(10) Patent No.: US 8,907,382 B2
(45) Date of Patent: Dec. 9, 2014

(54) SEMICONDUCTOR DEVICE AND FABRICATION METHOD THEREOF

(75) Inventor: Jui-Chun Chang, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 970 days.

(21) Appl. No.: 12/266,509

(22) Filed: Nov. 6, 2008

(65) Prior Publication Data

US 2009/0321875 A1    Dec. 31, 2009

(30) Foreign Application Priority Data

Jun. 30, 2008    (TW) ................................ 97124550 A

(51) Int. Cl.
| | | |
|---|---|---|
| H01L 23/00 | (2006.01) | |
| H01L 23/48 | (2006.01) | |
| H01L 21/762 | (2006.01) | |
| H01L 27/092 | (2006.01) | |
| H01L 29/78 | (2006.01) | |

(52) U.S. Cl.
CPC ....... *H01L 21/76264* (2013.01); *H01L 27/0922* (2013.01); *H01L 29/7824* (2013.01)
USPC ...................... 257/250; 257/E29.02

(58) Field of Classification Search
CPC ......... H01L 29/06; H01L 29/08; H01L 29/10; H01L 29/1203
USPC ...................... 257/520, E29.02, 523
See application file for complete search history.

(56) References Cited

U.S. PATENT DOCUMENTS

| | | | | |
|---|---|---|---|---|
| 6,013,936 | A | * | 1/2000 | Colt, Jr. ........................ 257/506 |
| 6,492,244 | B1 | * | 12/2002 | Christensen et al. ......... 438/404 |
| 7,256,456 | B2 | | 8/2007 | Ohkubo et al. |
| 7,262,109 | B2 | | 8/2007 | Lin et al. |
| 7,795,137 | B2 | * | 9/2010 | Saito et al. .................... 438/637 |
| 2006/0163635 | A1 | * | 7/2006 | Aitken et al. ................. 257/300 |
| 2006/0261444 | A1 | * | 11/2006 | Grivna et al. ................. 257/576 |
| 2007/0187769 | A1 | * | 8/2007 | Anderson et al. ............. 257/369 |
| 2007/0262411 | A1 | * | 11/2007 | Rauscher ...................... 257/506 |

FOREIGN PATENT DOCUMENTS

| | | |
|---|---|---|
| CN | 1536642 A | 10/2004 |
| CN | 101040374 A | 9/2007 |

* cited by examiner

*Primary Examiner* — Wael Fahmy
*Assistant Examiner* — Sarah Salerno

(57) ABSTRACT

A semiconductor device is provided. An insulating buried layer is formed in a substrate. Deep trench insulating structures are formed on the insulating buried layer. A deep trench contact structure is formed between the deep trench insulating structures. The deep trench contact structure is electrically connected with the substrate under the insulating buried layer.

14 Claims, 6 Drawing Sheets

US 8,907,382 B2

SEMICONDUCTOR DEVICE AND FABRICATION METHOD THEREOF

CROSS REFERENCE TO RELATED APPLICATIONS

This Application claims priority of Taiwan Patent Application No. 97124550, filed on Jun. 30, 2008, the entirety of which is incorporated by reference herein.

BACKGROUND OF THE INVENTION

1. Field of the Invention

The present invention relates to a semiconductor device and a fabrication method thereof, and in particular relates to a deep trench contact structure and a deep trench insulating structure and a fabrication method thereof.

2. Description of the Related Art

For present semiconductor techniques, an operational single-chip system has been achieved by highly integrating controllers, memory devices, low-operation-voltage circuits, and high-operation-voltage power devices, into a chip. Research development techniques of the power devices, such as vertical double diffused metal oxide semiconductor (VDMOS), insulated gate bipolar transistor (IGBT), lateral double diffused metal oxide semiconductor (LDMOS), or other techniques, have focused on increasing efficiency to decrease energy loss of the devices. Meanwhile, isolation structures are formed for isolating adjacent devices since high voltage transistors and the low voltage CMOS circuits are integrated into a chip.

FIG. 1 is a cross-section view illustrating a semiconductor device as known in the art. A deep trench insulator 20, formed of dielectric material, is usually used for isolating adjacent devices. Thus, power parameters of the isolated devices can be controlled, respectively. However, spurious capacitance occurs easily in the deep trench insulator 20, and a buried oxide layer 30 between an active region and a substrate 10. When the device is operated under a voltage, especially high voltage, coupling effect occurs due to charging of the spurious capacitance described above. The spurious coupling effect not only influences adjacent devices, but also influences other electrical connected devices of the substrate.

Continuing advances in semiconductor manufacturing processes have resulted in semiconductor devices with precision features and/or higher degrees of integration. However, with higher device speeds, it has become more difficult to control spurious capacitance or spurious resistance, thus hindering frequency improvement of the devices. The hindering effect is also called resistive capacitive delay (RC delay). RC delay results in not only hindering further increase of device speeds, but also exacerbates unnecessary energy loss. The effects described above influence not only working status but also stability of devices. RC delay is a major issue for semiconductor devices with higher speeds and lower tolerance for noise of the devices.

As such, a semiconductor and a fabrication method thereof mitigating the above deficiencies are needed.

BRIEF SUMMARY OF INVENTION

A detailed description is given in the following embodiments with reference to the accompanying drawings.

The invention provides a semiconductor device. An insulating buried layer is formed in a substrate. Deep trench insulating structures are formed on the insulating buried layer. A deep trench contact structure is formed between the deep trench insulating structures. The deep trench contact structure is electrically connected with the substrate under the insulating buried layer.

The invention provides a method for fabricating a semiconductor device. An insulating buried layer is formed in a substrate. Deep trench insulating structures are formed on the insulating buried layer. A deep trench contact structure is formed between the deep trench insulating structures. The deep trench contact structure is electrically connected with the substrate under the insulating buried layer.

BRIEF DESCRIPTION OF DRAWINGS

The present invention can be more fully understood by reading the subsequent detailed description and examples with references made to the accompanying drawings, wherein.

DETAILED DESCRIPTION OF INVENTION

Figure 1:
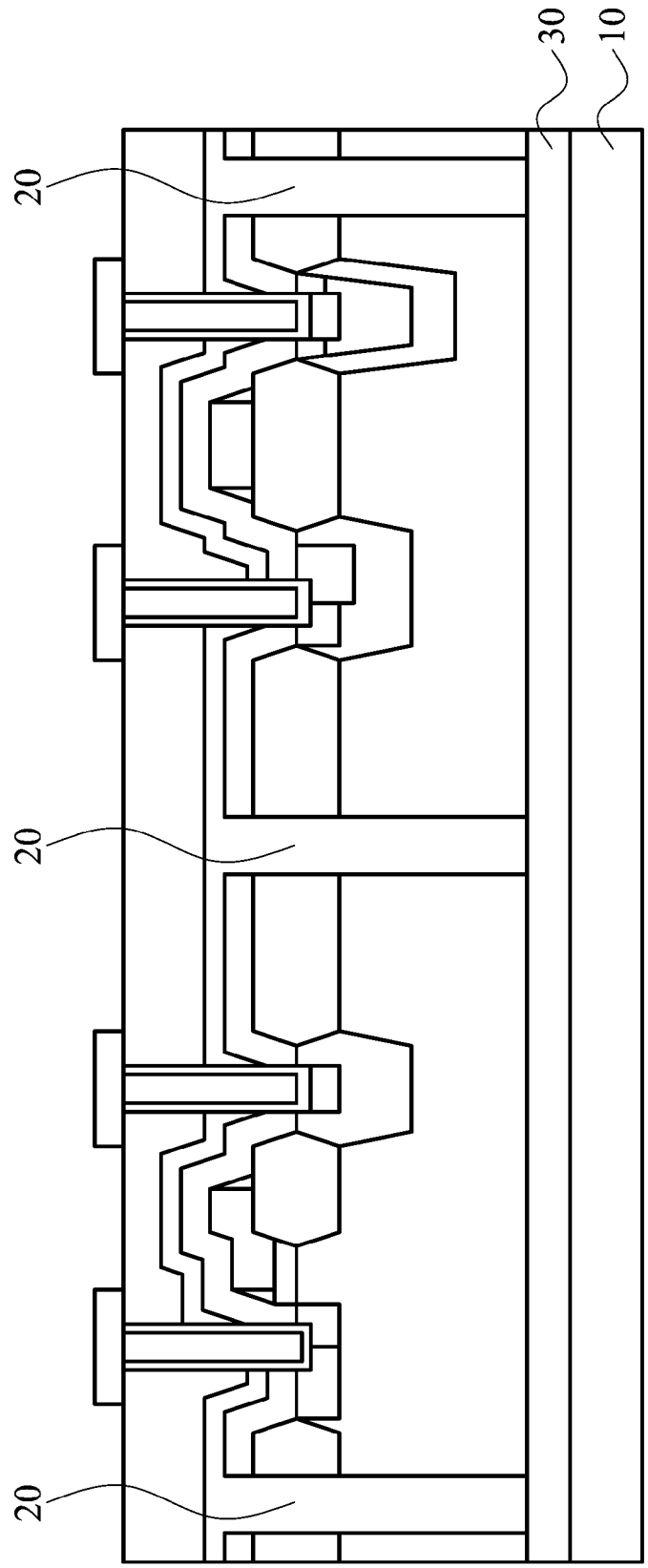
FIG. 1 is a cross-section view illustrating a semiconductor device as known in the art.

The following description is of the best-contemplated mode of carrying out the invention. This description is made for the purpose of illustrating the general principles of the invention and should not be taken in a limiting sense. The scope of the invention is best determined by reference to the appended claims.

Embodiments of the present invention provide a semiconductor device and a method for forming a semiconductor device. References will be made in detail to the present embodiments, examples of which are illustrated in the accompanying drawings. Wherever possible, the same reference numbers are used in the drawings and the descriptions to refer to the same or like parts. In the drawings, the shape and thickness of one embodiment may be exaggerated for clarity and convenience. The descriptions will be directed in particular to elements forming a part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Figure 2:
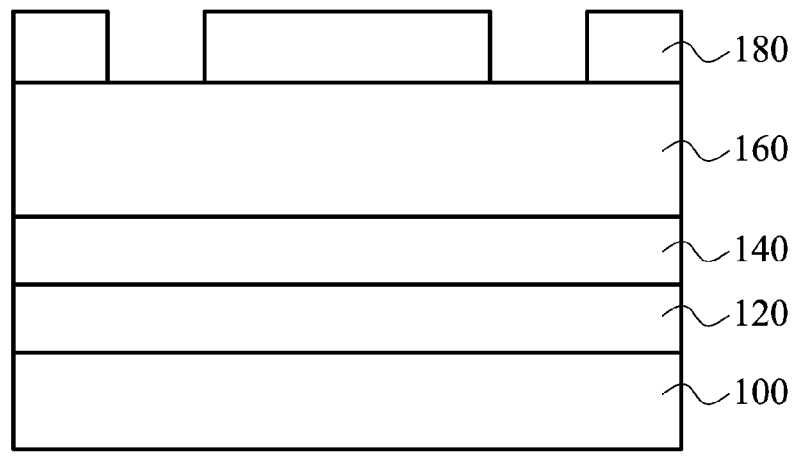
FIGS. 2 to 9 are cross-section views illustrating an embodiment of the method for fabricating the semiconductor device.

FIGS. 2 to 9 are cross-section views illustrating an embodiment of the method for fabricating the semiconductor device. Referring to FIG. 2, a substrate 100 is provided. A conductive buried layer 120, an insulating buried layer 140 and an epitaxial layer 160 are formed on the substrate 100. The substrate 100 may comprise silicon or other suitable semiconductor material. The insulating buried layer 140 may comprise oxide, such as silicon dioxide. A resistance of the conductive buried layer 120 is less than a resistance of the substrate 100. In one embodiment, since the resistance of the substrate is minimal, the conductive buried layer 120 is not formed (not shown). After forming a mask layer 180 on the epitaxial layer 160, the mask layer 180 is patterned to expose a surface of the epitaxial layer 160. The mask layer 180 may be an oxide, nitride, oxynitride or common photoresist.

Figure 3:
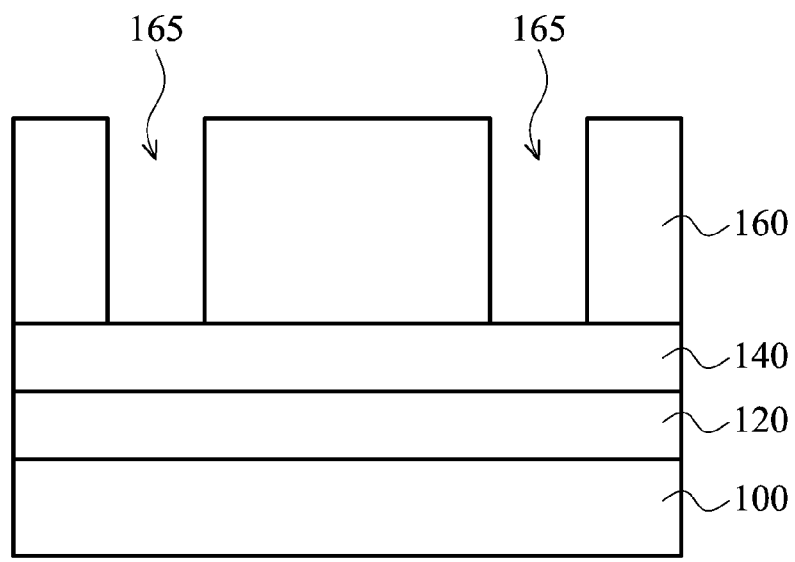

Referring to FIG. 3, after forming the patterned mask layer 180 on the epitaxial layer 160, the epitaxial layer 160 exposed by the mask layer 180 is removed by an etching process to form a deep trench 165 exposing a top surface of the insulating buried layer 140. In other embodiments, the epitaxial layer 160 exposed by the mask layer 180 and a portion of the insulating buried layer 140 under the epitaxial layer 160 are removed by an etching process, not shown, to form the deep trench 165 exposing a part the insulating buried layer 140 under the top surface of the insulating buried layer 140. The mask layer 180 is then removed.

Figure 4:
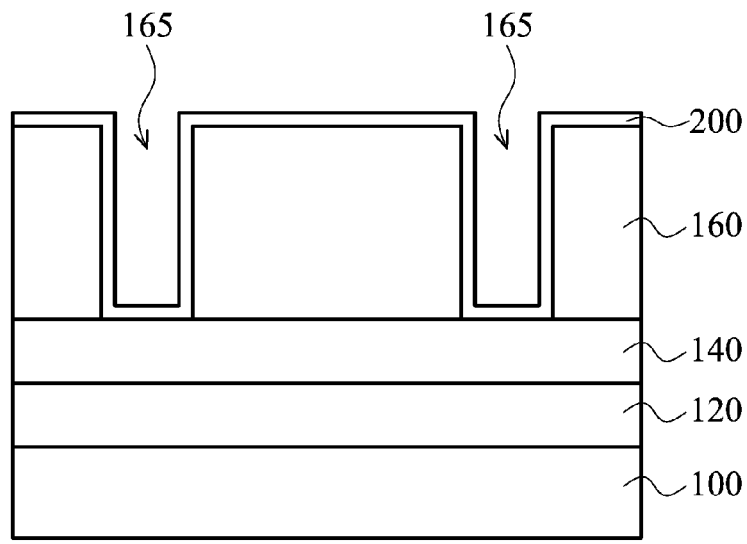

Referring to FIG. 4, after forming the deep trench 165, a liner layer 200 is formed on a side wall and a bottom surface of the deep trench 165. The liner layer 200 may be extended into a surface of the epitaxial layer 160. The liner layer 200 may comprise an oxide, such as tetra-ethyl-ortho-silicate (TEOS) based oxide.

Figure 5:
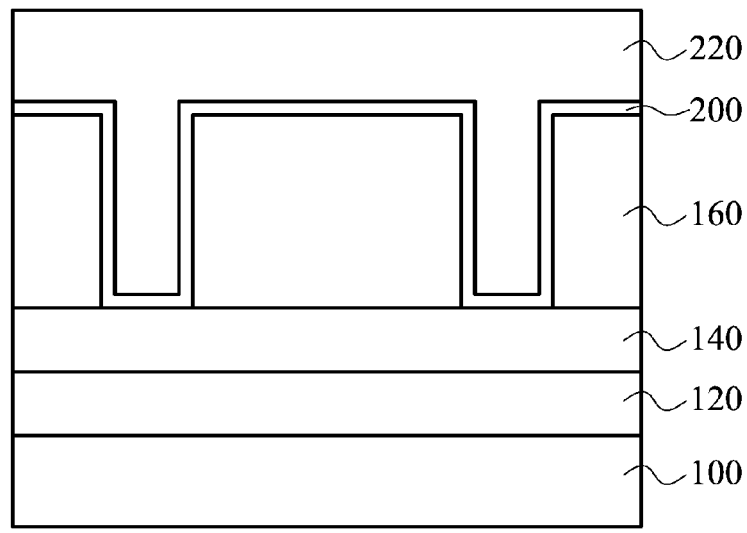

Referring to FIG. 5, after forming the liner layer 200, an insulating material 220 is formed to fill the deep trench 165. The insulating material 220 may be extended into a surface of the liner layer 200. In the preferred embodiment, the insulating material 220 is undoped polysilicon. With increasing crystal lattice differences of the oxide of the liner layer 200 and the epitaxial layer 160, a stress occurs easily in an interface between the liner layer 200 and the epitaxial layer 160. A structural defect may be formed due to increasing crystal lattice differences following a high temperature process. By choosing an undoped polysilicon as an insulating material 220 the stress between the materials may be buffered, thus improving the stability and the efficiency of devices. In other embodiments, the insulating material 220 can be other suitable materials.

Figure 6:
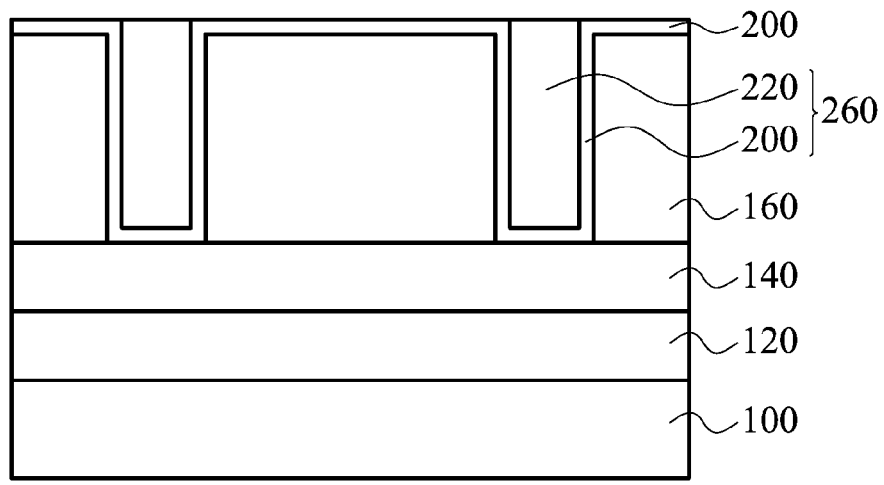

Referring to FIG. 6, the insulating material 220 above the liner layer 200 is removed by an etching back or CMP process to form a deep trench insulating structure 260.

Figure 7:
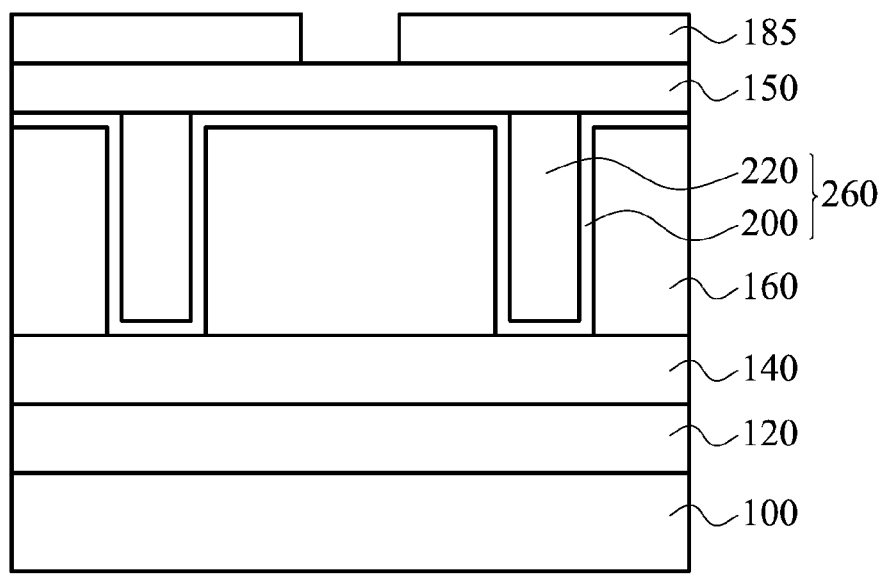

Referring to FIG. 7, an inter layer dielectric layer 150 is formed on the deep trench insulating structure 260 and the insulating material 220. A mask layer 185 is formed and then patterned to expose a surface of the inter layer dielectric layer 150. The mask layer 185 may be an oxide, nitride, oxynitride or common photoresist.

Figure 8:
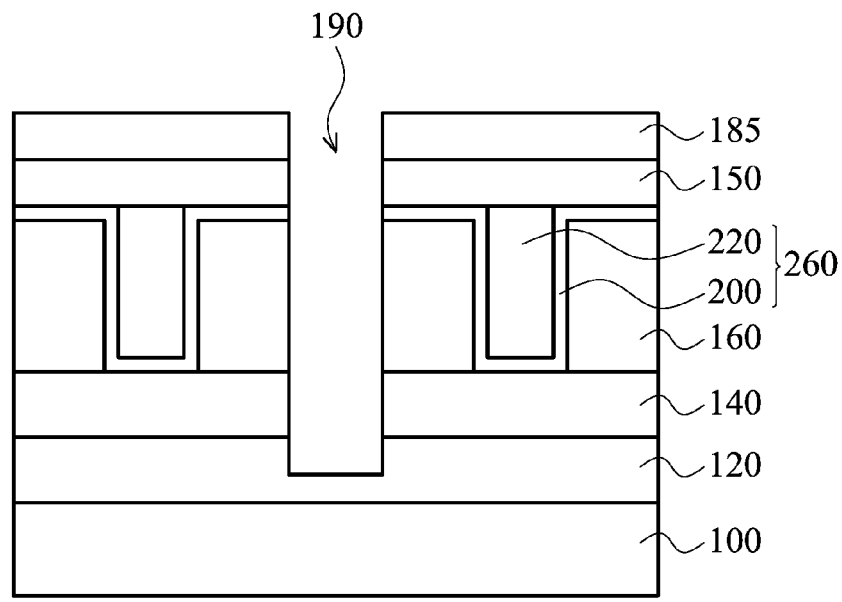

Referring to FIG. 8, after forming the patterned mask layer 185 on the inter layer dielectric layer 150, a deep trench 190 is formed between the deep trench insulating structures 260 by etching the inter layer dielectric layer 150, and the insulating material 220, epitaxial layer 160, insulating buried layer 140 and a partial depth of the conductive buried layer 120 under the insulating material 220 exposed by the mask layer 185. The deep trench 190 exposes a part of the conductive buried layer 120 under the top surface of the conductive buried layer 120. In one embodiment, the deep trench 190 (not shown), exposing the top surface of the conductive buried layer 120, is formed between the deep trench insulating structures 260 by etching the inter layer dielectric 150, and the insulating material 220, epitaxial layer 160, insulating buried layer 140 under the insulating material 220 exposed by the mask layer 185. In other embodiments, without the conductive buried layer 120, the deep trench 190 may expose the top surface of the substrate 100, or a part of the substrate 100 under the top surface. The mask layer 185 is then removed.

Figure 9:
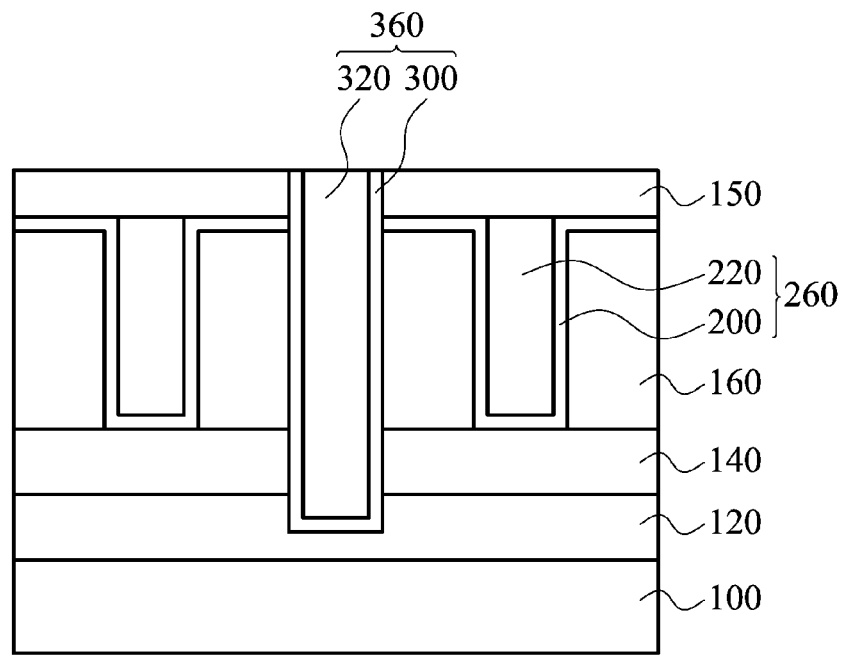

Referring to FIG. 9, after forming a barrier layer 300 on a bottom and a sidewall of the deep trench 190, a conductive material 320 is formed to fill the deep trench 190. As the conductive material 320 is extended on the inter layer dielectric 150, the conductive material 320 above the inter layer dielectric 150 can be removed by an etching back or CMP process to form a deep trench contact structure 360. The barrier layer 300 may be titanium, titanium nitride or other suitable materials. The conductive material 320 may be tungsten or other suitable materials.

Figure 10:
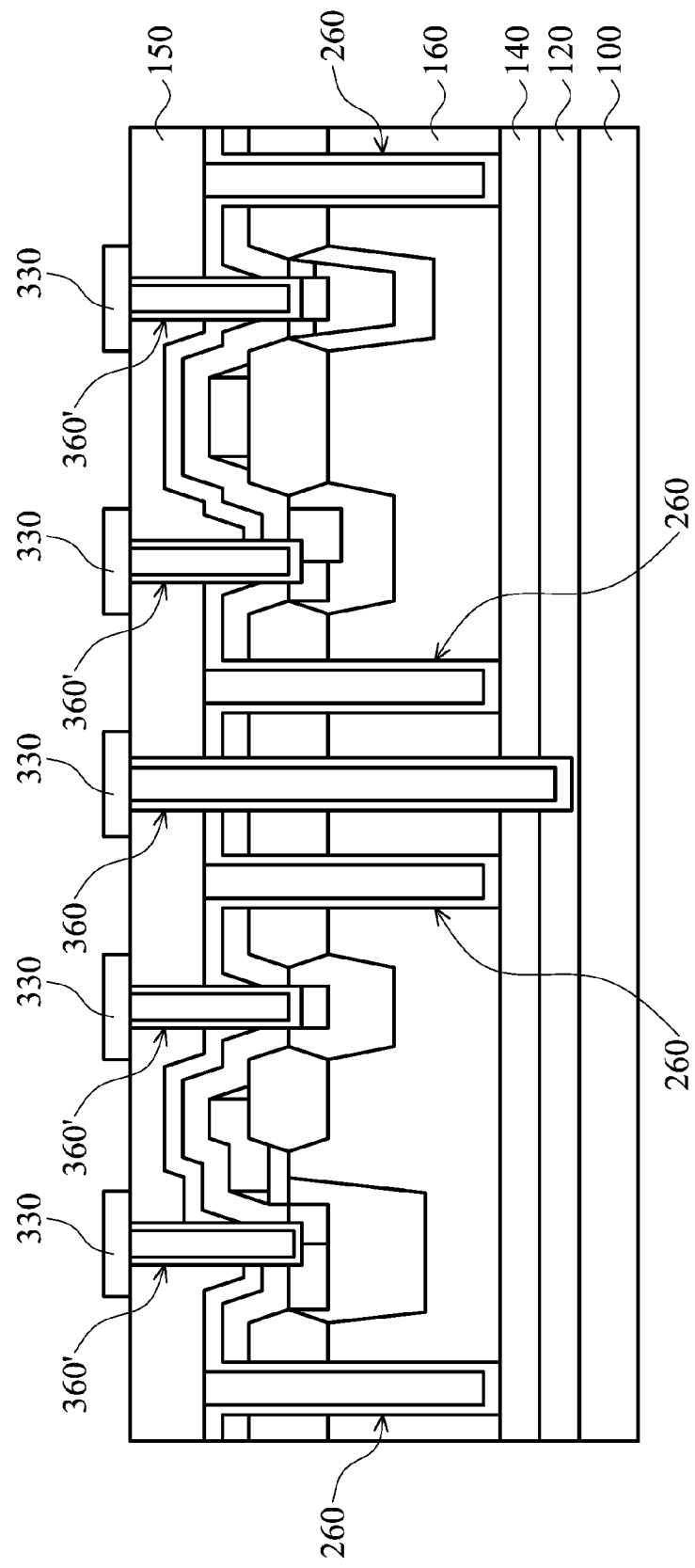
FIG. 10 shows a cross section of an adjusted embodiment according to the embodiment of FIGS. 2-9.

FIG. 10 shows a cross section of an adjusted embodiment according to the embodiment of FIGS. 2-9. Referring to FIG. 10, the deep trench insulating structure 260 is formed for isolating adjacent devices. The deep trench contact structure 360 may be formed by the same method for forming a contact plug 360' electrically connected with devices. Thus, the deep trench contact structure 360 and the contact plug 360' can be formed at the same time by a process without an additional step. Therefore, the cost can be reduced. A metal layer 330 may be formed on the deep trench contact structure 360. The conductive buried layer 120 and the deep trench contact structure 360 can be electrically and externally connected by the metal layer 330. In other embodiments (not shown), without the conductive buried layer 120, the substrate 100 under the insulating buried layer 140 can be electrically and externally connected by the deep trench contact structure 360 and the metal layer 330.

Since the conductive buried layer 120 (or substrate 100) and the deep trench contact structure 360 are electrically connected to an external power source by the metal layer 330, a spurious charge, induced in the insulating buried layer 140, the deep trench insulating structure 260, or the epitaxial layer 160 adjacent to the conductive buried layer 120 (or substrate 100) or the deep trench contact structure 360 when operating the device, can be externally transferred by the conductive buried layer 120 (or substrate 100) adjacent to the insulating buried layer 140 and the deep trench insulating structure 260 or epitaxial layer 160, and by the deep trench contact structure 360 with the grounding external power source electrically connected with the conductive buried layer 120 (or substrate 100) and the deep trench contact structure 360. Thus, noise due to spurious capacitance can be avoided. The voltage of the conductive buried layer 120 (or the substrate 100) can be externally controlled through the deep trench contact structure 360.

The embodiments of the invention have several advantages, for example, a method is provided for forming a semiconductor device, comprising forming deep trench insulating structures in a substrate with an insulating buried layer and a conductive buried layer formed therein. A deep trench contact structure, adjacent to the deep trench insulating structures and electrically connected to the conductive buried layer, is formed between the deep trench insulating structures. An epitaxial layer is etched to form a deep trench. A liner layer is formed on a bottom surface and a sidewall of the deep trench. The deep trench is filled with the insulating material to form the deep trench insulating structure. By choosing an undoped polysilicon as the insulating material, stress due to increasing crystal lattice differences of the liner layer comprising oxide and the epitaxial layer can be buffered, and stability and efficiency of the device can thus be improved.

The deep trench contact structure, formed between and adjacent to the deep trench insulating structures, and the conductive buried layer (or substrate) can be electrically and externally connected by the metal layer. Thus, a spurious charge, induced in the insulating buried layer or the deep trench insulating structure, can be externally transferred by the deep trench contact structure or the conductive buried layer (or substrate). Therefore, noise due to spurious capacitance can be avoided. The voltage of the conductive buried layer (or substrate) can be externally controlled through the deep trench contact structure. The deep trench contact structure can be formed by the same method for forming a contact plug electrically connected with devices. Thus, the deep trench contact structure and the contact plug can be formed at the same time by a process without an additional step. Therefore, the cost can be reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a substrate;
   a conductive buried layer formed on the substrate;
   an insulating buried layer formed over the conductive layer;
   deep trench insulating structures formed on the insulating buried layer in respective first trenches, wherein the deep trench insulating structures are not formed through the insulating buried layer;
   an inter layer dielectric formed on the deep trench insulating structures; and
   a deep trench contact structure formed between the deep trench insulating structures, wherein the deep trench contact structure is formed in a second trench to pass through the inter layer dielectric and partially through the conductive buried layer, wherein the deep trench insulating structures are each spaced apart and separated from the deep trench contact structure, and the conductive buried layer and the deep trench contact structure are electrically connected to a grounding external power source.

2. The semiconductor device as claimed in claim 1, wherein the deep trench insulating structure comprises an insulating material.

3. The semiconductor device as claimed in claim 2, wherein the insulating material comprises undoped polysilicon.

4. The semiconductor device as claimed in claim 2, wherein the deep trench insulating structure further comprises a liner layer formed on a bottom surface and a sidewall of the insulating material.

5. The semiconductor device as claimed in claim 4, wherein the liner layer comprises oxide.

6. The semiconductor device as claimed in claim 1, wherein the deep trench contact structure comprises a conductive material.

7. The semiconductor device as claimed in claim 6, wherein the conductive material comprises tungsten.

8. The semiconductor device as claimed in claim 6, wherein the deep trench contact structure further comprises a barrier layer formed on a bottom surface and a sidewall of the conductive material.

9. The semiconductor device as claimed in claim 8, wherein the barrier layer comprises titanium or titanium nitride.

10. The semiconductor device as claimed in claim 1, wherein the conductive buried layer is electrically connected with the deep trench contact structure.

11. The semiconductor device as claimed in claim 1, wherein resistance of the conductive buried layer is less than resistance of the substrate.

12. The semiconductor device as claimed in claim 1, wherein the deep trench contact structure is formed to pass through the inter layer dielectric and only partially penetrating through the conductive buried layer.

13. The semiconductor device as claimed in claim 1, wherein the deep trench insulating structures are separated from the conductive buried layer by the insulating buried layer.

14. The semiconductor device as claimed in claim 1, wherein the first trenches and the second trench are formed through an epitaxial layer, the epitaxial layer separating the first trenches and the second trench.

* * * * *